US007574309B2

(12) United States Patent
Strittmatter

(10) Patent No.: US 7,574,309 B2
(45) Date of Patent: Aug. 11, 2009

(54) INTERNAL BIAS MEASURE WITH ONBOARD ADC FOR ELECTRONIC DEVICES

(75) Inventor: Daniel Strittmatter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 11/698,159

(22) Filed: Jan. 26, 2007

(65) Prior Publication Data

US 2007/0124092 A1 May 31, 2007

Related U.S. Application Data

(62) Division of application No. 11/052,847, filed on Feb. 9, 2005, now Pat. No. 7,188,036, which is a division of application No. 10/461,413, filed on Jun. 16, 2003.

(51) Int. Cl.
*G06F 19/00* (2006.01)
(52) U.S. Cl. ........................................ 702/57; 341/155
(58) Field of Classification Search ............. 702/57–58, 702/90–91, 107, 117, 119–120, 182; 341/118, 341/155, 120–121, 139, 141, 143–144; 324/73.1, 324/76.15, 130, 601; 348/180
See application file for complete search history.

(56) References Cited

U.S. PATENT DOCUMENTS

| | | | | | |
|---|---|---|---|---|---|
| 4,340,856 | A | * | 7/1982 | Orlandi ...................... | 714/735 |
| 5,353,031 | A | * | 10/1994 | Rathi ......................... | 342/372 |
| 5,600,322 | A | * | 2/1997 | Garavan ..................... | 341/172 |
| 5,852,415 | A | * | 12/1998 | Cotter et al. ................ | 341/120 |
| 5,953,681 | A | | 9/1999 | Cantatore et al. | |
| 6,252,536 | B1 | * | 6/2001 | Johnson et al. ............. | 341/155 |
| 6,268,813 | B1 | * | 7/2001 | de Wit ........................ | 341/120 |
| 6,301,514 | B1 | * | 10/2001 | Canada et al. .............. | 700/108 |
| 6,334,440 | B1 | * | 1/2002 | Cochran ................. | 128/201.27 |
| 6,424,276 | B1 | * | 7/2002 | Munoz et al. ............... | 341/120 |
| 6,486,806 | B1 | * | 11/2002 | Munoz et al. ............... | 341/120 |
| 6,570,144 | B1 | * | 5/2003 | Lee et al. .................. | 250/208.1 |

(Continued)

OTHER PUBLICATIONS

Brandt, Brain P and Lutsky, Joseph, *A 75-mW, 10-b, 20-MSPS CMOS Subranging ADC with 9.5 Effective Bits at Nyquist*, IEEE Journal of Solid-State Circuits, vol. 34, No. 12, Dec. 1999, pp. 1788-1795.

(Continued)

*Primary Examiner*—Edward Raymond
*Assistant Examiner*—Mary C Baran
(74) *Attorney, Agent, or Firm*—Dickstein Shapiro LLP

(57) ABSTRACT

An apparatus and method for on-chip bias measurement of an analog signals on an integrated circuit with a switchable analog-to-digital converter capable of performing testing and other types of processing. Analog signal test locations are selected for testing by a test input selector which is in turn controlled by a controller on an integrated circuit, such as an imager chip. Test locations are connected to one or more analog-to-digital converters through the test input selector. The analog-to-digital converter(s) output a test measurement digital output to either test equipment or an on-chip calibration circuit. Test equipment or on-chip calibration circuits adjusts imager component bias or other operating parameters used in chip or device operation based on output from the analog-to-digital converter(s).

5 Claims, 7 Drawing Sheets

U.S. PATENT DOCUMENTS

| | | | | |
|---|---|---|---|---|
| 6,707,492 | B1 * | 3/2004 | Itani | 348/229.1 |
| 6,799,133 | B2 * | 9/2004 | McIntosh et al. | 702/120 |
| 6,903,670 | B1 * | 6/2005 | Lee et al. | 341/118 |

OTHER PUBLICATIONS

Moon, Un-Ku and Song, Bang-Sup, *Background Digital Calibration Techniques for Pipelined ADC's*, pp. 1-29.

McCaffrey, Nathanial, *CMOS Active Pixel Sensors with Extended Dynamic Range For High-Performance Machine Vision*, Vision Show 2000 Sarnoff Corporation, Mar. 17, 2000.

*Understanding Data Converters Application Report, Texas Instruments*, Mixed-Signal Products SLAA013, 1995, pp. i-iv and 1-17.

Kugelstadt, Tom, *Switched-Capacitor ADC Analog Input Calculations Application Report*, Texas Instruments, Digital Signal Processing Solutions SLAA036, Sep. 1998, pp. i-iv and 1-6.

Austin, John, *Getting the Full Potential From Your ADC, Application Report*, Burr-Brown Products from Texas Instruments, SBAA069A, Mar. 2001, Revised Sep. 2002, pp. 1-4.

*TLC1225I, TLC1225M Self-Calibrating 12-Bit-Plus-Sign Analog-to-Digital Converters*, Texas Instruments, SLAS029B, Aug. 1990, Revised Dec. 1993, pp. 1-14.

* cited by examiner

INTERNAL BIAS MEASURE WITH ONBOARD ADC FOR ELECTRONIC DEVICES

CROSS-REFERENCE TO RELATED APPLICATIONS

This application is a divisional of U.S. patent application Ser. No. 11/052,847, filed on Feb. 9, 2005 now U.S. Pat. No. 7,188,036, which is a divisional of U.S. patent application Ser. No. 10/461,413, filed on Jun. 16, 2003, both of which are incorporated in their entirety by reference herein.

FIELD OF THE INVENTION

The present invention relates generally to the measurement and calibration of analog integrated circuits such as, for example, imagers and other devices.

BACKGROUND OF THE INVENTION

Integrated circuits such as complementary metal-oxide semiconductors (CMOS) or charge-coupled devices (CCD) are used in processing analog image signals. For example, a CMOS or CCD imager device is a light sensitive integrated circuit that stores and outputs image data. Typically, image data is generated in the form of analog signals from pixels or image elements. A photosensitive section of a pixel reacts to exposure to light or photons which then drives an electrical charge into a storage element. CMOS and CCD image sensors are used in a wide variety of applications including digital cameras, surveillance systems, sensor systems and scanning systems. Analog signal processors are also used in a variety of other applications including temperature sensors, battery chargers, voice recognition circuits and many others.

Testing of individual devices comprising an integrated circuit is an essential part of integrated circuit production. Test result information is useful in identifying defective circuits and diagnosing problems relating to circuit operation and design. A number of techniques have been developed to perform circuit operating parameter measurements such as the use of test probes on test equipment which are applied to probe pads on integrated circuit wafers during production and testing of integrated circuits.

Conventional imager chip design also has made use of probe or test pads for use with measuring equipment in order to perform testing. Common techniques include provision of an on-chip probe pad which can be used with a test station probe to perform desired testing.

The use of probes and probe pads have previously provided satisfactory results in test processing. However, decreases in the size of dies as well as increase in circuit density of chips have resulted in increased difficulty in providing sufficient probe pads on the die to permit required test procedures to be carried out without extensive design effort in probe pad design. Also, improvements in test equipment design have not provided an adequate solution to reduction in die size, increased circuit density, increased chip complexity and increased testing requirements leading to constraints in probe pad availability.

Imager chip calibration in conjunction with test processing has also become more difficult as die size has decreased and circuit complexity has increased. Imager chip calibration typically is accomplished by use of test probe measurements accompanied by automatic or manual calibration of operational performance attributes of chip circuits or components. Calibration has been accomplished by use of various types of manual procedures or methods including the use of a laser to burn fuses associated with registers to program or set on-chip registers to a particular value which affects specific imager component operations.

BRIEF SUMMARY OF THE INVENTION

Embodiments of the present invention provide on-chip measurement and calibration for devices with analog signal sources or signals, such as an imager. Test nodes or circuits of a device, such as an imager chip, are selected for testing by a test input selector circuit. The test input selector is controlled by a logic controller which connects the selected test node or circuit with an on-chip analog-to-digital converter (ADC). The ADC then outputs a digital value corresponding to a test measurement from the selected test node or circuit. Calibration or test equipment can be coupled to the imager chip and can read out digital test values from the ADC. An on-chip calibration circuit can adjust operational parameters of components on the imager based on an output from the ADC, either through external control or automatically in response to the output of the ADC.

Various exemplary embodiments and methods of their operation are discussed in detail below. These and other features of the invention are described in more detail below in connection with the accompanying drawings.

DETAILED DESCRIPTION OF THE INVENTION

Figure 1:
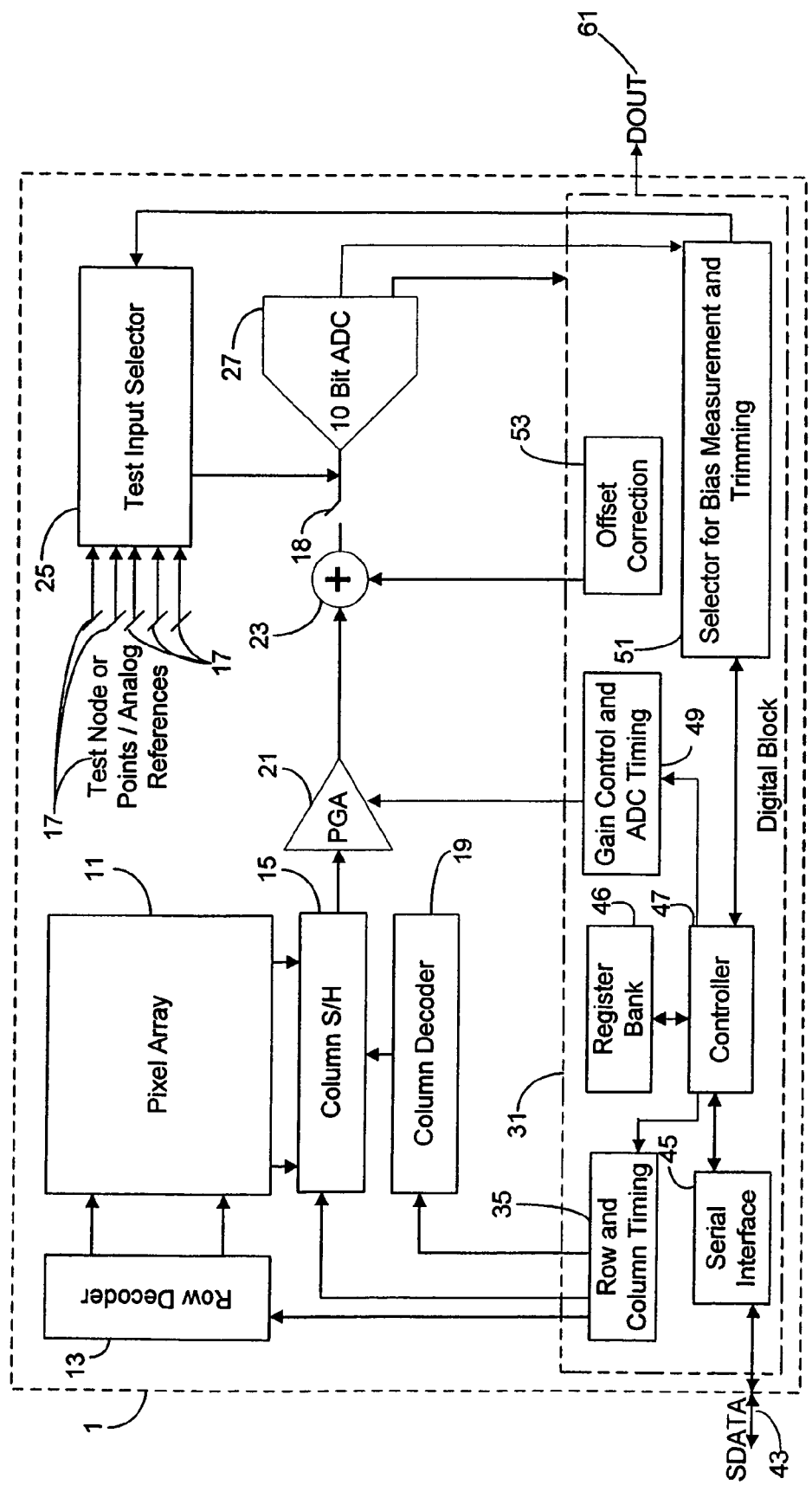
FIG. 1 shows a block diagram of an imager constructed in accordance with a first exemplary embodiment of the invention.
Figure 3:
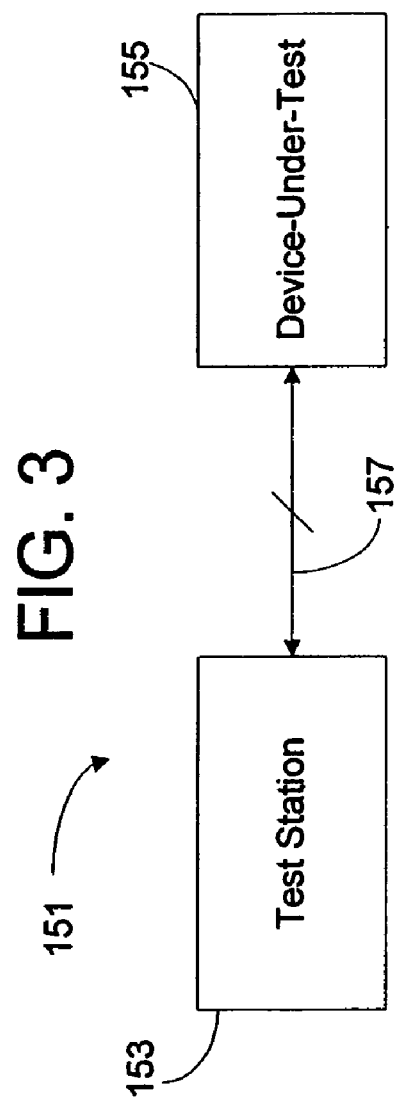
FIG. 3 shows a block diagram of a test station for testing an electronic device with a calibration system constructed in accordance with a third exemplary embodiment of the invention.

FIG. 1 shows an imager 1 in accordance with one exemplary embodiment of the invention. A pixel array 11 is coupled to a row decoder 13 and a column decoder 19 through a sample and hold circuit 15. A digital block 31 contains digital control circuits including a row and column timing circuit 35 which controls column and row decoding and readout. The row and column timing (RCT) circuit 35 is controlled by a controller 47 that controls functions on the imager chip 1. The register bank 46 stores data values which are used by circuitry within the imager for imager operations, testing operations and calibration operations. A serial interface 45 receives control signals from an external control unit (not shown). Serial interface 45 is a serial slave device driven by a serial master unit (not shown), which can be a controller within a camera or other system that is controlling the imager's 1 operation including a test station coupled to interface 45. Probe pads (not shown) can be placed on the imager chip 1 to permit a test station, such as shown in FIG. 3, to communicate with controller 47 or other components within the chip by use of the probe pads alone, or in conjunction with serial interface 45 or a combination thereof. The controller 47 can be reprogrammed off-chip through an interface, such as serial interface 45 or probe pads. The words "pad" and "pin" are used interchangeably herein.

Imager 1 has inputs that include SDATA 43 which are serial data bus input/output pads. SDATA 43 pads are used as probe pads during device testing as well as bond pads during imager assembly into an end-item application or device such as a digital camera. SDATA 43 signals include an initiation signal to command controller 47 to enter a test mode from an external test station (e.g., FIG. 4) as well as programming inputs for controller 47, register bank 46 or other imager 1 chip components from the external test station. In situations where the test input selector (TIS) 25 receives off chip inputs in addition to on-chip inputs, a variety of input schemes can be used to connect TIS 25 to the off-chip signal source. For example, TIS 25 can be connected to its own input/output bus which receives off-chip analog signals or it can receive inputs from additional analog input pads on imager 1 coupled to TIS 25. Imager 1 has outputs that include DOUT 61 which are multi-bit bus pads that output processed pixel array data. DOUT 61 pads are used during imager 1 testing and also as bond pads during packaging into an end-item. Test equipment can be coupled to DOUT 83 pads to receive outputs including processed pixel array 11 outputs as well as measurement and calibration signals.

A programmable gain array (PGA) 21 is coupled to the sample and hold circuit 15 for receiving outputs from the array 11. PGA 21 receives a digital input from a gain control and ADC timing circuit 49, which programs the PGA 21. The PGA 21 controls signal gain for signals output from the sample and hold circuit 15. The gain control and ADC timing circuit 49 receives an input from the controller 47, which generates windowing, exposure, gain and biasing as well as other control signals or data.

The PGA 21 outputs an adjustable boosted or unboosted signal from the sample and hold circuit 15 to an adder circuit 23. The adder circuit 23 also receives a selectable input from an offset correction circuit 53 within the digital block 31. The digital block 31 has circuitry that controls switch 18 thereby selecting or deselecting inputs to the ADC 27 from the adder 23. The ADC 27 receives inputs from the adder 23 when switch 18 is closed or from TIS 25. TIS 25 inputs can also be routed into adder 23 as well such that adder 23 merely passes TIS 25 inputs or the output of PGA 21 to ADC 27. Additional switches may be placed between adder 23 and PGA 21 as well as between the adder 23 and offset correction circuit 53 to isolate the output of the PGA 21 and the output of offset correction circuit 53. ADC 27 performs digitizing of an analog signal input from the output of adder circuit 23 or output of TIS 25 into a multi-bit digital signal output, in this embodiment a 10-bit output. A selector for bias measure and trimming (SBMT) circuit 51 receives the digital output from the ADC 27. It should be understood that the words "trim" or "trimming" are used interchangeably with "calibrate", "calibration", "calibrating" as well as "adjust" or "adjusting" with reference to the invention.

The SBMT circuit 51, which receives a digital signal from the ADC 27, can use the measurement result internally for calibration or can send the results outwardly of the chip on output DOUT 61 or through serial interface 45 over link 157 (FIG. 3) through controller 47, depending on which test mode the controller 47 is operating in. It should be understood that the functions of controller 47 and SBMT 51 can be performed by a processor suitably programmed.

There are several different test modes that controller 47 and SBMT 51 can enter into. Test modes include a test station controlled test mode where initiation, measurement and calibration determinations are controlled by the external test station (e.g., FIG. 4), a second test mode where the test station directs controller 47 to enter a test mode and the controller 47 and SBMT 51 control test and calibration processing on-chip until calibration is complete (e.g., FIG. 5) and a third test mode where the test mode is self-initiated on the chip and all operations are fully automatic without external commands (e.g., FIG. 6).

Figure 4:
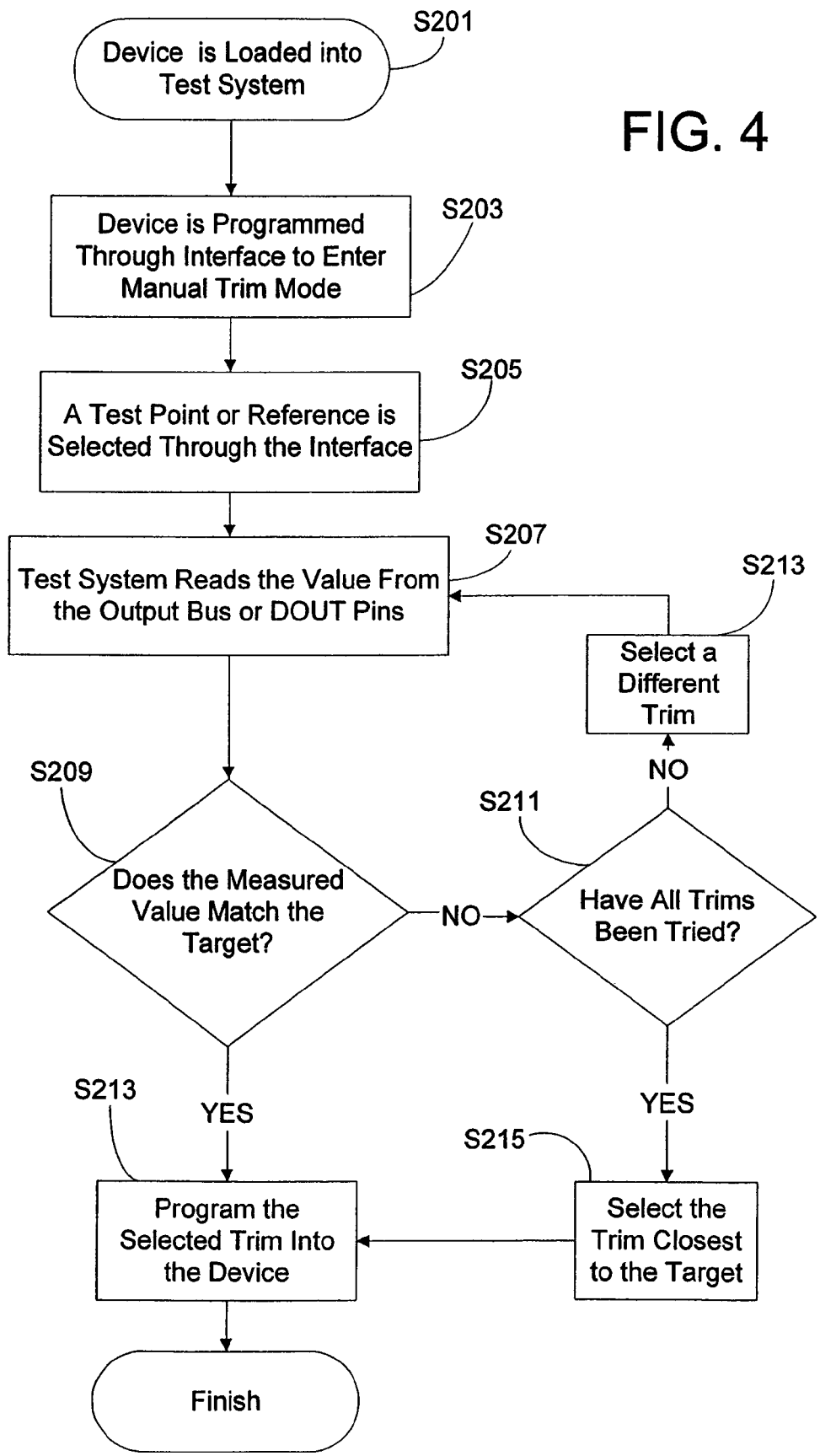
FIG. 4 shows a processing sequence for performing measurements and calibration in accordance with a first processing exemplary embodiment of the invention.

In the first test mode, test station 153 (FIG. 3) directs controller 47 to initiate testing and calibration processing and begin one or more cycles of testing (e.g., FIG. 4). Test station 153 will send controller 47 data over communication link 157 through serial interface 45 (FIG. 1) which causes controller 47 to send test node or analog reference point 17 selection data to the SBMT 51, which then sends an address signal(s) to TIS 25 to select the desired test node(s)/analog reference point(s) 17. The terms test node and reference point are used interchangeably in this application for convenience, however, it should be understood that they can be different types of signals. A reference signal can be a value which is used to measure other circuits while a test node can be a point in an analog circuit which performs a function and assumes a different value during analog circuit operations. Controller 47 then cycles the imager 1 such that the selected test nodes/ analog references 17 can be measured. TIS 25 passes selected analog signals back to ADC 27 which sends digital values to SBMT 51, which then outputs the measured signals to test station (e.g., 153, FIG. 3) through DOUT 61.

Test station 153 then performs comparisons between the measured value and a stored digital comparison value. If the values do not match, then test station 153 will send a signal to controller 47 through interface 45 to select or store a trim value from test station 153 which will be used during imager operations that affect the test node/analog reference point being tested. Controller 47 will then be directed by test station 153 to perform another test cycle which results in another measured signal output as described above to the test station 153. Test station 153 determines again if the measured value matches a stored comparison value. If a match is not found, then the above cycle is repeated until a match is found or all available trim values have been attempted without a match. If a match is found, then test station 153 sends controller 47 a trim value to either select or store within register bank 46, which will then be used for imager operations. If no match is found, then the test station 153 will select the trim value that resulted in the smallest variation between measured and digital comparison value then have controller 47 set that value in register bank 46. FIG. 4 further describes processing for the first test mode below.

Figure 5:
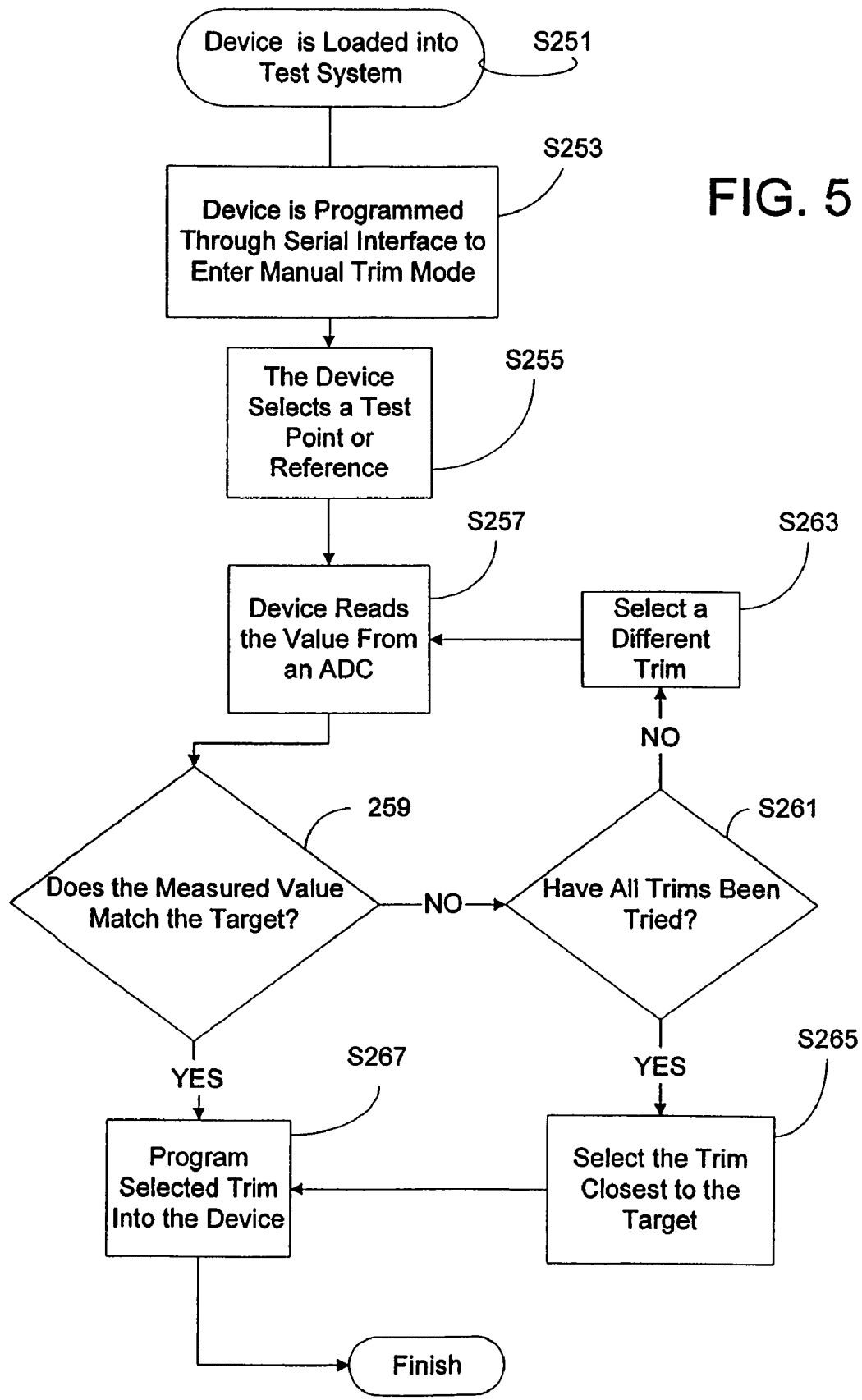
FIG. 5 shows another processing sequence for performing measurements and calibration in accordance with a second processing exemplary embodiment of the invention.

In the second test mode, the controller 47 enters a test mode based upon an external command to do so from, for example, a test station (e.g., 153, FIG. 3) connected to imager 1 and begins one or more cycles of measurement and calibration processing (e.g., FIG. 5). In a modified second test mode, controller 47 can also enter a test mode based on an internal self-initiated test command. Self-initiation can be caused by the controller 47 detecting a condition, such as, an error signal, timing value or a time elapsed determination which will then trigger self-testing. Once testing and calibration is completed, the SMBT 51, or test station 153, sends a signal to controller 47 to terminate testing and calibration processing.

Once the controller 47 enters the second test mode, it will direct the SBMT 51 to send control signals to the TIS 25 to select a particular test node or analog reference point 17 for testing. The controller 47 will either determine which test node/reference 17 is to be tested based upon a self-test protocol or a test station (e.g., 153 of FIG. 3) will direct the controller 47 to begin testing for a particular test node/reference 17. Controller 47 sends SBMT 51 a table to load from register bank 46, which contains multiple trim values that are used during measurement and calibration operations. Controller 47 sends the table values to the SBMT 51 on power on, upon command from a test station (e.g., 153) or upon initiation of measurement and calibration operations. SBMT 51 selects trim values in the stored table, directs controller 47 to set a selected trim value for use in testing a selected test node/analog reference 17 and then directs controller 47 to begin another test cycle (e.g., FIG. 5, S257, S259, S261, S263) for the selected node or analog reference signal 17. The controller 47 also sends a digital comparison value stored in register bank 46 corresponding the selected test node/analog reference signal 17 to the SBMT 51. The SBMT 51 will use the digital comparison value to compare a digitized measured value from the selected test node/analog reference 17 to determine if calibration is required.

The SBMT 51 reads out the data from ADC 27, then makes a determination of whether or not trimming is required based upon the digital comparison value received from register bank 46 and the measured value. If SBMT 51 determines trimming is required, then SMBT 51 will send a request to controller 47 to set a particular trim value from register bank 46 corresponding to trim values stored in the table the SBMT 51 previously received from controller 47. SBMT 51 also makes a determination of whether the current trim value or the previously selected trim value produced a closer match between the digital comparison value and a measured value. If the current value produced a closer match, then the current trim value (or an address to that value) is stored. If the current value did not produce a closer match than the preceding value, then the previous trim value is retained in memory as the closest match.

If no match between digital comparison value and measured value is found, then SBMT 51 directs controller 47 to select another trim value. Controller 47 selects another value and sets that value for use in operation of the test node/analog reference 17 which has been selected. The controller 47 will then perform another test or measurement cycle for the test node/analog reference 17 under test. The TIS 25 will read out another measurement signal into the SBMT 51 which will again determine if the measured value matches the digital comparison value previously received from the controller 47. This cycle of testing continues until a match is found between the measured value and digital comparison value or all trim values have been attempted. If all trim values have been attempted and a resulting measurement shows no match between the measured value and digital comparison value, the trim value that produced the smallest variation between the measured and digital comparison value will be selected and set for use in imager 1 by controller 47. Once the SBMT 51 determines measurement and calibration processing is completed, controller 47 sends a signal to test station 153 to indicate measurement and/or calibration processing is completed.

The third test mode is different from the first and second test modes in that the controller 47 on the imager 1 initiates test processing without test station initiation. Controller 47 also does not send a measurement and/or calibration processing complete signal to test station 153. Otherwise, the testing and calibration processing is the same as in the second test mode.

Trimmed chip operating parameters include, but are not limited to, bias levels, gain levels and exposure levels. Test nodes or analog reference points 17 include locations for test signals affected by bias currents or voltages, gain levels, exposure levels, temperature measuring elements or timing parameters.

It should be noted that multiple on-chip ADCs may be used with the invention. Also, the PGA 21 and Gain Control circuit 49 are not required if an analog input signal is sufficiently strong to permit an ADC 27 to perform analog to digital conversions. In addition, the ADC 27 can be any bit-size and have various configurations for input or output as long as it is capable of being coupled with test points or reference signals 17 on the imager 1. The invention can also be used with off-chip analog or control inputs (not shown in FIG. 1) that are coupled to the TIS 25 through an interface or on-chip probe pads. Examples of off-chip inputs include analog signals from a battery charger or a battery built into a digital camera that requires calibration, measurement or both. Also, the controller 47 can be designed to output fault codes or signals through SDATA 43 or DOUT 61 to indicate that a system fault has been detected during measurement and calibration processing. The imager chip 1 can be a CMOS image sensor or a CCD system which can be used in a digital camera system or cell phones with imager chips. Controller 47 can also select imager pixel array test points not coupled to TIS 25 within an imager array 11 using the row and column select switches 13, 19 which pass pixel signals to PGA 21 and adder 23 to ADC 27.

Alternative embodiments can include controller 47 and SBMT 51 designed to perform the above described logical trimming as well as non-logical trimming or both. Non-logical trimming includes adjusting stored charge levels in imager 1, changing timing values which affect charge accumulation or discharge, and adjusting sequencing operations on the imager 1 in order to perform trimming operations. Timing values can be stored in the register bank 46 or in other registers on imager chip 1 that can be adjusted or changed. Logical or non-logical trimming can be performed by controller 47, SBMT 51, a test station or a combination thereof.

Figure 6:
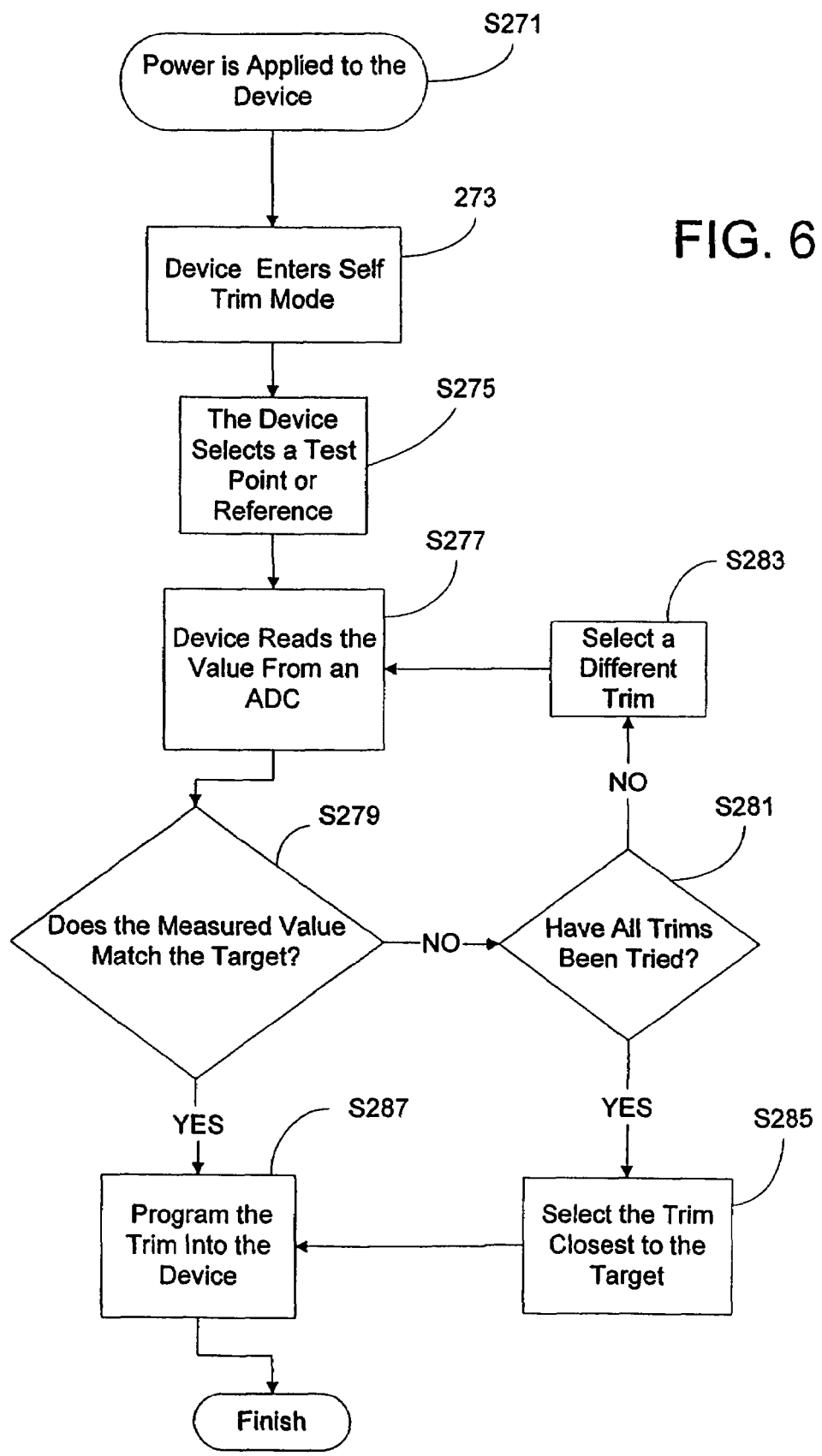
FIG. 6 shows another processing sequence for performing measurements and calibration in accordance with a third exemplary processing embodiment of the invention.

A variety of approaches can be used by controller 47 or SBMT 51 to make calibration value choices based on a calculated value instead of a table value, a stored table or a combination of both. For example, calculated values can include trim values that are adjusted from a base value for temperature or other factors that affect the effectiveness of a trim value in a particular circuit or test point 17 being trimmed. Another example can incorporate an algorithm programmed within either controller 47 or SBMT 51 to randomly or sequentially select trim values from a sequence of values until the closest match between the digital comparison value and a measured value is achieved. A set of ranges can also be used as a digital comparison value instead of a single numerical value in order to perform determinations of whether a measured value matches a digital comparison value. FIGS. 4-6 further describe exemplary embodiments of test and calibration apparatuses in accordance with the invention.

Figure 2:
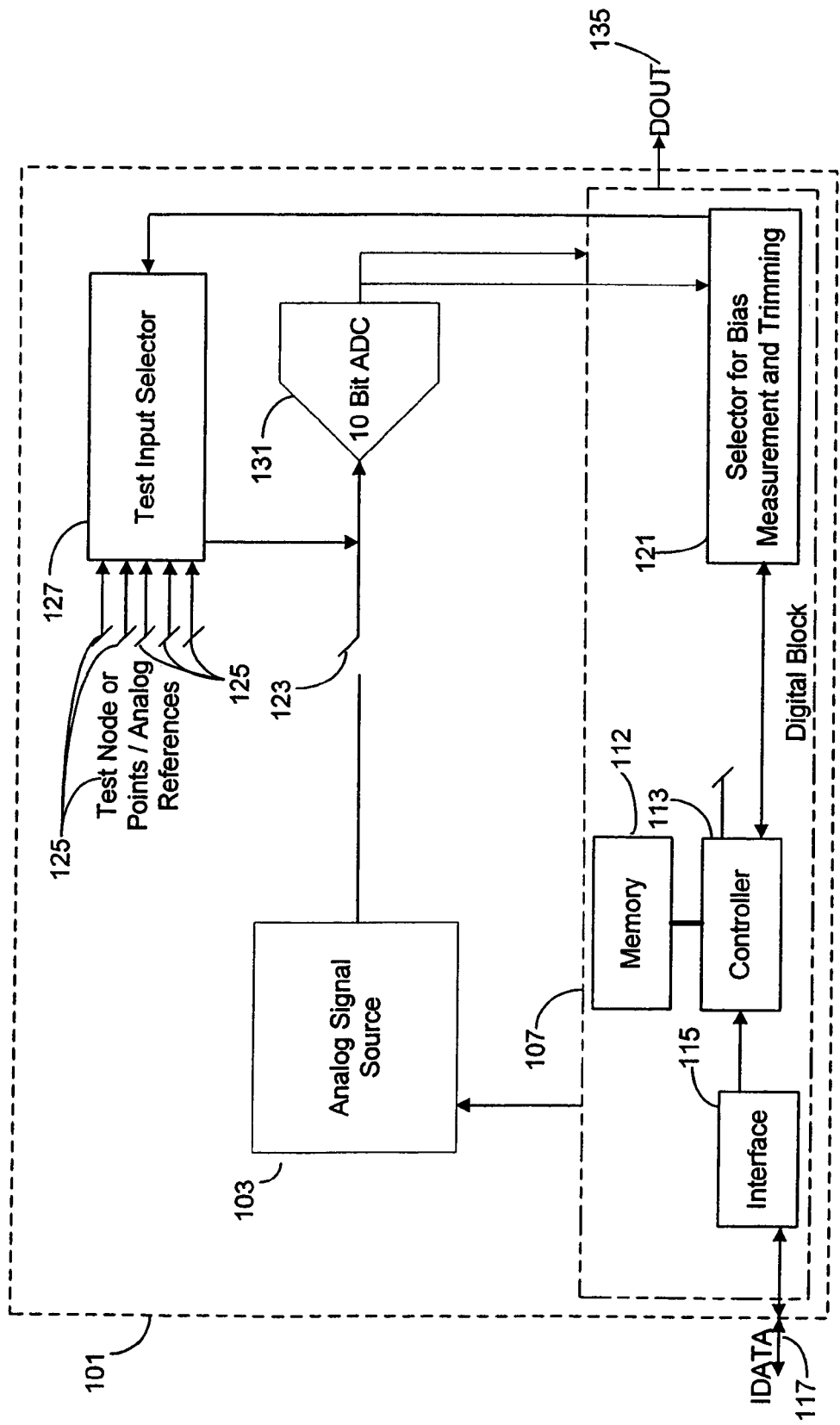
FIG. 2 shows a block diagram of an electronic device constructed in accordance with a second exemplary embodiment of the invention.

Referring to FIG. 2, an integrated circuit 101 with an on-chip analog signal source 103 and a measurement and calibration system selectably coupled to an on-chip ADC 131 in accordance with a second exemplary embodiment of invention is shown. FIG. 2 shows one example of how the invention can be used more generally in any analog signal integrated circuit with an on-chip analog source and on-chip ADC. The integrated circuit 101 receives an IDATA signal input 117 which controls the interface 115 to the integrated circuit 101. The output, DOUT 135, is a multi-bit digital output of the converted analog signals processed by the ADC 131 and digital block 107. The analog source 103, producing analog signals, is coupled to ADC 131. Controller 113 generates control signals for the integrated circuit 101 and other control or data signals. The controller 113 can be reprogrammed off-chip through interface 115.

The digital block 107 has circuitry that selects or deselects the switch 123, thereby enabling or disabling inputs from the analog signal source 103 to ADC 131. ADC 131 performs digitizing of an analog signal input from analog source 103 or TIS 127 into a multi-bit digital signal output, in this embodiment a 10-bit output. The digital block 107 and a SBMT circuit 121 receives the digital output from the ADC 131.

The SBMT circuit 121, controller 113, memory 112 and TIS 127 operate as described above with reference to FIG. 1. As described above, SBMT 51 controls the trimming of integrated circuit 101 with an on-chip source of analog signals (i.e., source 103). Test points 125 can include locations for bias currents or voltages, temperature measuring elements, and timing parameters.

FIG. 3 shows an external test system 151 that can be used to test a chip constructed in accordance with the FIG. 1 or FIG. 2 embodiments of the invention. Test system 151 can be used to test a device-under-test 155 incorporating an ADC coupled to an onboard selectable measurement and calibration system such as shown in the FIGS. 1 and 2 exemplary embodiments. Test station 153 can be coupled to a device-under-test 155 during calibration operations using a variety of well known techniques. Probe or other interface techniques can be used to interface or access the device 153 using on-chip or wafer probe pads or other interface systems suitable for connecting test station 153 to a device-under-test 155. As explained above with respect to the first test mode and second test mode for the FIGS. 1 and 2 embodiments, and below with respect to FIGS. 4-5, testing and calibration operations with respect to the test station 153 can be initiated by test station 153 or by logic on the device-under-test.

While FIGS. 1 and 3 are referenced in explaining methods of processing described herein, FIG. 2 and other embodiments can also be used with the processing sequences described below. Accordingly, the following processing sequences are not limited to use with the FIGS. 1 and 3 exemplary embodiments.

FIG. 4 shows a method of operation for test station controlled operational parameter trimming of an integrated circuit. The circuit (as described above) includes a switchable ADC for digitizing output from a measurement and calibration system and an analog source on the same chip. At processing segment S201, an imager chip, e.g., chip 1 (FIG. 1), is connected to the test system (e.g., 151, FIG. 3) by connecting the device 1 to a test station (e.g., 153, FIG. 3) by interconnect 157. The test station 153, through interconnect 157, sends and receives signals through interconnect 157 to a device under test (e.g., imager 1). In the case of the FIG. 1 or 2 embodiments, test station 153 is connected to pads for serial interface 45 or 115 that are used to perform communication between device-under-test 155 and test station 153. Separate probe pads can also be used to interface or establish communication with the device-under-test 155. The test station 153 also houses a digital capture unit (not shown) which is connected to the imager's output bus, commonly referred as "DOUT" pins or pads (e.g., output signal 61, FIG. 1).

At processing segment S203, the imager 1 is programmed through the interface (e.g., serial interface 45 or probe pads) to activate the SBMT 51. The SBMT 51 then selects an input/test point (e.g., 17) using TIS 25 and an analog reference or test point signal 17 is sampled and passed to the ADC 27 from the TIS 25 at processing segment S205. SBMT 51 or controller 47 can control switch 18 to isolate PGA 21, adder 23 and offset correction circuit 53 from ADC 27 and TIS 25 when TIS 25 selects test points (e.g., 17). Examples of test points/reference points 17 include locations for bias currents, timing signal levels, charge accumulation points and temperature sensor signals. The sampled analog test point or reference 17 signal is processed into the digital block 31 and then output from the DOUT pins 61 to the test station 153 at processing segment S207.

At processing segment S209, a determination is made by the test station 153 as to whether or not the measured value matches a target value. "Target value" refers to a stored, input, or value determined by the calibration system which is used to determine if a sampled test/reference location 17 signal is within design parameters or requires trimming. The terms target value and digital comparison value are used synonymously herein. Determination of whether the measured value matches the target value at processing segment S209 is done by the test station 153. If the measured value does not match the target value at processing segment S209, then a determination is made at processing segment S211 as to whether or not another trim value is available to be used for the calibration of a selected signal associated with a test/reference location in imager 1.

If it is determined that additional trim adjustments are available (at processing segment S211), then a different trim value is selected and applied to adjust the measured signal at processing segment S215. Several ways of trimming the device-under-test are available including, but not limited to, laser processing or use of electrical or non-volatile storage elements connected to the controller 47 that can be selected to thereby adjust a signal associated with a selected test/reference location 17. Trimming can also be accomplished manually or automatically. Automatic trimming can be accomplished by programming a non-volatile memory register storing a value used for chip operations. Programmed non-volatile memory data can then be used to scale or adjust signals from test/reference locations 17 that are being calibrated. Non-volatile memory elements can include an on-chip flash memory. Manual trimming can be accomplished with a laser fuse to activate circuitry to trim a device or by other electrical means such as an anti-fuse element.

Returning to processing segment 207, the test station 153 reads out another test value from the DOUT pins 61. At processing segment S209, another determination is made as to whether or not the measured value matches a target value for a selected test point or reference 17. If the measured value does not match the target value (at processing segment S209), then a determination is next made at processing segment S211 as to whether or not all trim or adjustments have been attempted. If no further trim or adjustment values are available, then a trim value that is closest to the target value in the test station is selected at processing segment S215. Next, at processing segment S213, the last selected trim is selected or programmed into the device-under-test before processing terminates.

Circuits or signals that can be trimmed include any analog signals which are input into or generated on a chip with onboard measurement and calibration using a switchable ADC. Trimming is accomplished by automatic or manual means. Automatic trimming can be accomplished by setting a register value or an anti-fuse which is used to adjust a signal associated with a test/reference location 17 such as is described above in reference to the FIG. 1 embodiment. Manual trimming can be accomplished by use of a laser which sets signal values on a chip.

If at processing segment S209 a measured value matches a target value, then the current trim value is programmed or selected in the device-under-test 1 at processing segment S213 and processing terminates. Calibration processing, as shown in FIG. 4 or as will be shown below, can continue until a predetermined condition is met, such as a number of calibration loops, an external signal, a measured value or an internal value.

A default value can be used as an initial trim setting which can be loaded at system start-up or before processing sequence S207. An alternative embodiment can have the processing segment 209 determination accomplished in the SBMT 51 (FIG. 1) and/or controller 47 then have the comparison result sent back to test apparatus for further processing.

FIG. 5 shows a method of operation for test station initiated device parameter trimming in accordance with a second exemplary processing embodiment of the invention. The FIG. 5 processing sequence can be used with an embodiment of the invention which has an interface, an on-chip ADC and a switching circuit which switches between several types of analog inputs into the ADC including test inputs and other types of inputs such as a digital imager input as described in FIG. 1 or other types of signals as shown in FIG. 2 or as discussed below in-connection with alternative embodiments of the invention.

At processing segment S251, device-under-test (e.g., imager chip 1, FIG. 1) is connected to a test system apparatus (e.g., 153, FIG. 3). The test station 153 provides serial communication to the device 1 in this embodiment, but other types of communication can be used with the invention. At processing segment S253, the device 1 is programmed through the serial interface 45 to activate a self-test mode, e.g., second test mode described above, in the SBMT 51. At processing segment S255, the SBMT 51 sends a control signal to the TIS 25 which selects an analog test/reference point 17 and passes a measured signal to an ADC 27. The measured signal is then converted to a digital measured value by ADC 27. The SBMT 51 is controlled by the controller 47 in this embodiment.

The ADC 27 converts an input analog signal into a digital measurement signal and the signal is read out of the ADC 27 into, in this example, the SMBT 51 and the controller 47, at processing segment S257. At processing segment S259, a comparison is made of the digital signal read out of the ADC 27 and a determination is made as to whether or not the digital signal matches a target signal, e.g., the digital comparison value discussed above in connection with the FIG. 1 embodiment. In this example, the target signal is stored in the register bank 46. However, an embodiment of the invention can have the test station 153 pass the target signal to controller 47, which is then passed to the SBMT 51 for comparison with a measured signal.

If the measured digital signal does not match the target signal, SBMT 51 determines if all available trim adjustments have been attempted at processing segment S261. If another trim adjustment is available, then an unselected trim value is selected and passed to controller 47 by SBMT 51, then controller 47 applies the adjusted trim value to adjust an operational parameter on the device, at processing segment S263. Applying an unselected trim value can include changing a parameter stored in the controller 47. Next, the controller 47 cycles the device, e.g., imager 1, using the adjusted operational parameter and again reads out a value from the ADC 27 at processing segment S257. Again, SMBT 51 determines if a match is found between the target and the measured digital signal for the selected test/reference location from the ADC 27 at processing segment S259. If there is not a match at processing segment 259, then a determination is made of whether or not all trim values have been applied without resulting in a subsequent match between a selected test/reference location signal and a target value at processing segment S261. If no unselected trim values remain, then the closest trim value will be selected at processing segment S265 and the selected trim value programmed into the register bank 46 by controller 47 as directed by SBMT 51 at processing segment S267.

If at segment S259 the measured value matches the target value associated with a selected test/reference point, then the selected trim value will be used to program the device 1 at processing segment S267 and processing terminates.

The selected trim value can be read out of the device 1 by the test station 153 for use with programming the device 1, such as by laser trimming of storage elements on the device 1 by the test station 153, or the device 1 can program a selected trim into itself using electrical or non-volatile storage elements on the device 1 by controller 47.

Pixel array 11 signals can also be selected by the controller 47 through the row decoder 13 and column decoder 19 in processing segment S253 by the controller 47 and passed to the ADC 27. Alternative embodiments of the FIG. 5 processing sequence can have the test station 153 (FIG. 3) controlling the SBMT 51, depending on design of the device 1 and/or test station 153.

FIG. 6 shows a method of operation for on-chip initiated automatic operational parameter trimming in accordance with a third embodiment of the invention. The following discussion of FIG. 6 refers to FIG. 1 as one example of how the FIG. 6 processing sequence operates. However, the invention is not limited to the exemplary embodiment as shown in FIG. 1.

In this exemplary processing sequence, the device trimming or calibration is accomplished at chip 1 power-up. However, calibration or trimming can be accomplished at other times during the chip operation and in response to a variety of conditions including detection of one or more predetermined imager signal values. A second external controller for a separate analog system in a device (e.g., battery charger) along with imager chip 1 (e.g., a digital camera), can provide communicate with controller 47 within device 1 during processing to also initiate or terminate testing and calibration operations as well.

At processing segment S271, power is applied to the device 1. At processing segment S273, the device 1 automatically begins self trim mode as initiated by controller 47 when power is applied. At processing segment S275, the device 1 selects a test/reference point 17 (e.g., using TIS 25) and outputs a signal to ADC 27. The ADC 27 outputs a signal that is compared by the SBMT 51 with a target value, e.g., digital comparison value, which is stored in register bank 46.

If the measured digital signal does not match the target signal (S279), logic within the device 1 (e.g., controller 47 or SMBT 51) determines if all available trim adjustments have been attempted at processing segment S281. The system begins processing with a default trim value selected. If another trim adjustment is available, then an unselected trim value is selected and applied to adjust an operational parameter on the device 1 at processing segment S283. Applying an unselected trim value can include changing a parameter stored in the controller 47. Next, the device 1 again reads out a value from the ADC 27 at processing segment S277. Logic within the device 1 (e.g., controller 47 or SMBT 51) determines if a match is found between the target and the measured digital signal from the ADC 27 at processing segment S279. If there is not a match at processing segment 279, then a determination is made as to whether or not all trim values have been attempted by SBMT 51 (segment S281). If no unselected trim values remain, then the closest trim value will be selected at processing segment S285 and the selected trim value programmed into the register bank 46 by controller 47 at the direction of SBMT 51 (at segment S287).

If at segment S279 the measured value matches the target value associated with the selected test/reference point 17, then the selected trim will be used to program the register bank 46 by controller 47 as directed by SBMT 51 at processing segment S287 and SBMT 51 directs controller 47 to terminate processing.

Processing steps as described in FIGS. 4, 5 and 6 can be accomplished using logic structures or processing sequences loaded into programmable devices on the device. For example, the controller 47, SMBT 51 or other components on the device 1 can be gate structures or programmable devices such as a field programmable gate array or other type of device that can store and execute instructions. SBMT 51 or controller 47 can also control a combination of a switching circuit (e.g., TIS 25) and other circuit selection circuits on a chip such as column and row select circuits 13, 19 in FIG. 1 to perform measurement and calibration processing with the on-chip ADC 27.

Figure 7:
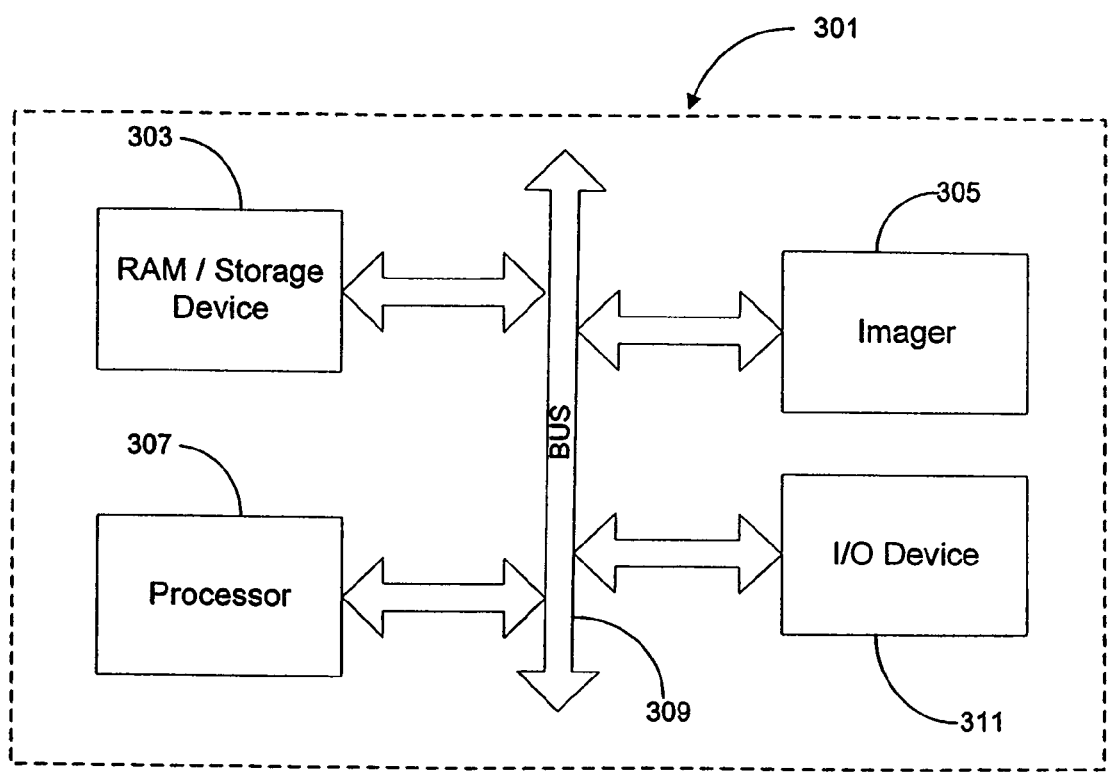
FIG. 7 shows a block diagram of a computer system constructed in accordance with a fourth exemplary embodiment of the invention.

FIG. 7 shows a block diagram of computer system 301 in accordance with another exemplary embodiment of the invention. The FIG. 7 system makes use of an imager with an on-chip ADC selectively coupled to an analog source, a test and calibration system or both. An imager 305 constructed in accordance with an embodiment of the invention, such as shown in FIG. 1, is coupled to a bus 309. The bus 309 is also coupled with a processor 307, a RAM/storage device 303, and an input/output device 311. Exemplary embodiments of the computer system 301 with an exemplary embodiment of imager 305 can include a surveillance system, a web camera or other computer system application with an imager component. Imager 305 has a controller 47 that can enter a self-test mode based upon an input from processor 307. The on-chip measurement and calibration processing system is used during imager 305 construction by a test station (e.g., FIG. 4). An exemplary embodiment of the FIG. 7 system 301 can also include an imager 305 that can initiate self-test and calibration based upon an input from processor 305. Processor 307 can initiate calibration processing based upon a variety of conditions such as initial power-up processing, ambient temperature changes, imager system fault detection, signal processing done within processor 307 or other conditions that indicate calibration processing is required. Imager 305 can also include an external analog test input as described above in reference to FIG. 1. External analog inputs can include power inputs to computer system 301, processor 307 power supply, battery backup power circuits or the backup battery itself.

The FIGS. 1 and 2 chips can be used in an electronic device with a controller which is coupled to the FIG. 1 or 2 chip, a mass storage device, a display and an output port. The electronic device can also be constructed without the mass storage device or display such as a cell phone. Another alternative embodiment can include an image sensor system with an image sensor, a switchable ADC coupled to imager circuitry as well as a FIG. 1 or 2 chips used in a system such as a Web camera or security camera. The FIGS. 1 and 2 system can also be used in system on-a-chip (SOC) embodiment. The SOC embodiment can be used in a stand-alone application such as a remote image logger. The FIGS. 1 and 2 chips could also be used within weather stations, "spy" cameras, traffic enforcement devices or devices which can be left and retrieved with stored image data.

Another alternative embodiment can use the FIG. 1 or 2 image chips within a processing system. The FIG. 1 or 2 chips can also be formed with a processor or digital signal processor (DSP) chip. The processor or DSP system controls the controller 47 or 113 and provides calibration through additional signal processing based upon measurements received from the DOUT 61 or DOUT 135 output port. Potential applications for the processing system include DVD players, hard drive controllers, home theater receivers and other systems which process analog signals with a DSP or processor chip.

The FIG. 1 imager can be used within an digital camera which also includes a battery charger. The battery charger can also be calibrated by the FIG. 1 measurement and calibration system.

Generally, the invention provides an on-chip measurement and calibration system which makes use of existing ADC components by addition of a measurement, calibration and switching section. A variety of embodiments are possible that can be used with a stand alone test system or with a test station or a combination thereof. Embodiments of the invention can include a variety of interface systems which allow for control of on-chip measurement and calibration operations as well as allowing the chip to control calibration of off-chip sources of analog signals.

The above description and drawings illustrate preferred embodiments which achieve the features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An imager system, said imager system comprising:
   an integrated circuit comprising:
      an imager array containing a plurality of pixel circuits;
      at least two analog reference signal lines;
      at least one analog-to-digital converter for digitizing signals produced by said pixel circuits;
      a switching circuit configured to selectively couple at least one of said at least two analog reference signals lines to an input of said at least one analog-to-digital converter; and
      a control circuit for controlling said switching circuit, wherein said at least one analog-to-digital converter is configured to determine a digital test value for a selected analog reference signal line when said at least one analog-to-digital converter is coupled to said selected analog reference signal line by said switching circuit.

2. An imager system as in claim 1, wherein said control circuit is further configured to determine a calibration value based upon said digital test value, said control circuit configured to adjust at least one programmable operating parameter of one or more circuits of said integrated circuit based upon said calibration value.

3. An imager system as in claim 2, wherein said integrated circuit further comprises a register bank coupled to said control circuit, said register bank configured to store values comprising at least gain values and biasing values.

4. An imager system as in claim 2, wherein said integrated circuit further comprises a non-volatile storage section for storing digital values used by said control circuit to affect on-chip operations.

5. An imager system as in claim 1, further comprising a display adapted to display image data output from said at least one analog-to-digital converter.

* * * * *